US007312485B2

(12) United States Patent
Armstrong et al.

(10) Patent No.: US 7,312,485 B2

(45) Date of Patent: Dec. 25, 2007

(54) CMOS FABRICATION PROCESS UTILIZING SPECIAL TRANSISTOR ORIENTATION

(75) Inventors: Mark Armstrong, Hillsboro, OR (US); Gerhard Schrom, Hillsboro, OR (US); Sunit Tyagi, Portland, OR (US); Paul A. Packan, Beaverton, OR (US); Kelin J. Kuhn, Aloha, OR (US); Scott Thompson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/727,296

(22) Filed: Nov. 29, 2000

(65) Prior Publication Data

US 2002/0063292 A1 May 30, 2002

(51) Int. Cl.

| | |
|---|---|
| ***H01L 27/148*** | (2006.01) |
| ***H01L 23/63*** | (2006.01) |
| ***H01L 29/76*** | (2006.01) |
| ***H01L 31/062*** | (2006.01) |
| ***H01L 29/82*** | (2006.01) |

(52) U.S. Cl. ...................... 257/255; 257/358; 257/369; 257/254; 257/417; 257/418; 438/199; 438/50; 438/52; 438/53

(58) Field of Classification Search ................ 257/358, 257/369, 254, 417, 418, 255; 438/199, 50, 438/52, 53

See application file for complete search history.

(56) References Cited

U.S. PATENT DOCUMENTS

| | | | | |
|---|---|---|---|---|
| 3,965,453 | A * | 6/1976 | Seidel et al. | |
| 5,171,703 | A | 12/1992 | Lin et al. | |
| 5,981,325 | A * | 11/1999 | Hung | 438/224 |
| 6,046,494 | A | 4/2000 | Brigham et al. | |
| 6,897,526 | B1 * | 5/2005 | Miyanaga et al. | 257/345 |

FOREIGN PATENT DOCUMENTS

| | | |
|---|---|---|
| EP | 0703 628 A2 | 3/1996 |
| GB | 928562 | 6/1963 |
| GB | 1222251 | 2/1971 |
| JP | 1-162362 | 6/1989 |

OTHER PUBLICATIONS

Sayama et al. Effect of <100> Channel direction for high performance SCE immune pMOSFET with less than 0.15um gate length).*

(Continued)

*Primary Examiner*—Sara Crane
*Assistant Examiner*—Samuel A Gebremariam
(74) *Attorney, Agent, or Firm*—Blakely, Sokoloff, Taylor & Zafman LLP

(57) ABSTRACT

Complementary metal oxide semiconductor transistors are formed on a silicon substrate. The substrate has a {100} crystallographic orientation. The transistors are formed on the substrate so that current flows in the channels of the transistors are parallel to the <100> direction. Additionally, longitudinal tensile stress is applied to the channels.

11 Claims, 6 Drawing Sheets

OTHER PUBLICATIONS

Toshihiro, Matsuda, et al., "Electrical Characteristics of 0° /±45° /90° -Orientation CMOSFET with Source/Drain Fabricated by Various Ion-Implantation Methods", *IEEE Transactions on Electronic Devices*, vol. 46, No. 4, Apr. 1999.

Sayama, H., et al., "Effect of <100> Channel Direction for High Performance SCE Immune pMOSFET with Less Than 0.15 μm Gate Length", *IEEE*, 1999.

Welser, J. et al, "Strain Dependence of the Performance Enhancement in Strained-Si *n*-MOSFETs", *IEEE*, 1994.

Scott, Gregory, et al, "The Effect of Stress and Dopant Redistribution on Trench-Isolated Narrow Devices", *In Challenges in Process Integration and Device Technology*, Proceedingof SPIE vol. 4181, 2000.

Scott, Gregory, et al, "NMOS Drive Current Reduction Caused by Transistor Layout and Trench Isolation Induced Stress", *IEEE*, 1999.

PCT International Search Report, Aug. 26, 2002.

* cited by examiner

CMOS FABRICATION PROCESS UTILIZING SPECIAL TRANSISTOR ORIENTATION

TECHNICAL FIELD OF THE INVENTION

The present invention relates to semiconductor transistors, and more particularly, to a transistor structure oriented having a current flow parallel to a specific crystal direction.

BACKGROUND OF THE INVENTION

Complementary metal oxide semiconductor (CMOS) integrated circuits include both N-type devices (NMOS) and P-type devices (PMOS), the former utilizing electrons as the carriers and the latter utilizing holes as the carriers. CMOS technology is employed in the large majority of integrated circuits manufactured today.

An important factor in the performance of CMOS integrated circuits is the presence of good mobility for both holes and electrons. The mobility of both carriers should be as high as possible to enhance both PMOS and NMOS performance. The overall CMOS circuit performance depends similarly on both NMOS and PMOS performance, and thus in turn, on both electron and hole mobility.

It is known that the application of stress on a semiconductor material, such as silicon, changes the mobility of electrons and holes, which in turn modifies the performance of NMOS and PMOS devices formed thereon. An increase in mobility results in increased performance. However, it has also been found that the electron and hole mobilities do not always react the same way to stress, thereby complicating the process. In addition, the dependence of mobility on stress depends on the surface orientation of the crystalline semiconductor material and the directions of stress and current flow. For example, for current flow along the <110> directions on {100} planes, longitudinal tensile stress tends to increase the mobility of electrons and decrease the mobility of holes. In contrast, for current flow along the <100> directions on {100} planes, longitudinal tensile stress tends to increase the mobility of both electrons and holes.

Currently, semiconductor devices are oriented such that the current flows along the <110> direction on {100} silicon. This can be seen in FIG. 2, which shows a top view of a semiconductor wafer 201. The semiconductor wafer 201 is commonly referred to as "{100} silicon," which is the predominant type of semiconductor wafer being used today. In the prior art, NMOS and PMOS transistors 203 are oriented in such a manner so that the current flow between source and drain is aligned with the <110> direction, relative to the semiconductor wafer 201. Thus, the transistors 203 are oriented as shown in FIG. 2.

In this orientation, the mobilities of electrons and holes change inversely in reaction to longitudinal stress. In other words, when stress is applied to the underlying silicon along the direction of current flow, either the electron mobility is increased and the hole mobility is decreased or the hole mobility is increased and the electron mobility is decreased. Thus, in such an arrangement, the overall CMOS circuit performance is not enhanced.

For this reason, selective stressing of the silicon material must be employed to increase the carrier mobility of one type of device without degrading the mobility of the other type of device. Thus, stress may be applied to the wafer 201 in the location of transistor 203*a*, but not transistor 203*b*, or vice versa. This requires costly processing steps that may include masking, deposition, or etching.

DETAILED DESCRIPTION

Silicon (Si) is presently the most important semiconductor for the electronics industry. Most silicon that is used to form silicon wafers is formed from single crystal silicon. The silicon wafers serve as the substrate on which CMOS devices are formed. The silicon wafers are also referred to as a semiconductor substrate or a semiconductor wafer.

In crystalline silicon, the atoms which make up the solid are arranged in a periodic fashion. If the periodic arrangement exists throughout the entire solid, the substance is defined as being formed of a single crystal. If the solid is composed of a myriad of single crystal regions the solid is referred to as polycrystalline material.

Silicon, as used in integrated circuits, can be in one of three forms: (1) single crystal silicon, (2) polycrystalline silicon (polysilicon), and (3) amorphous silicon. As noted above, silicon wafers are fabricated to have single crystal form.

The periodic arrangement of atoms in a crystal is called the lattice. The crystal lattice also contains a volume which is representative of the entire lattice and is referred to as a unit cell that is regularly repeated throughout the crystal.

Silicon has a diamond cubic lattice structure, which can be represented as two interpenetrating face centered cubic lattices. Thus, the simplicity of analyzing and visualizing cubic lattices can be extended to characterization of silicon crystals. In the description herein, references to various planes in silicon crystals will be made, especially to the {100}, {110}, and {111} planes.

Figure 1:
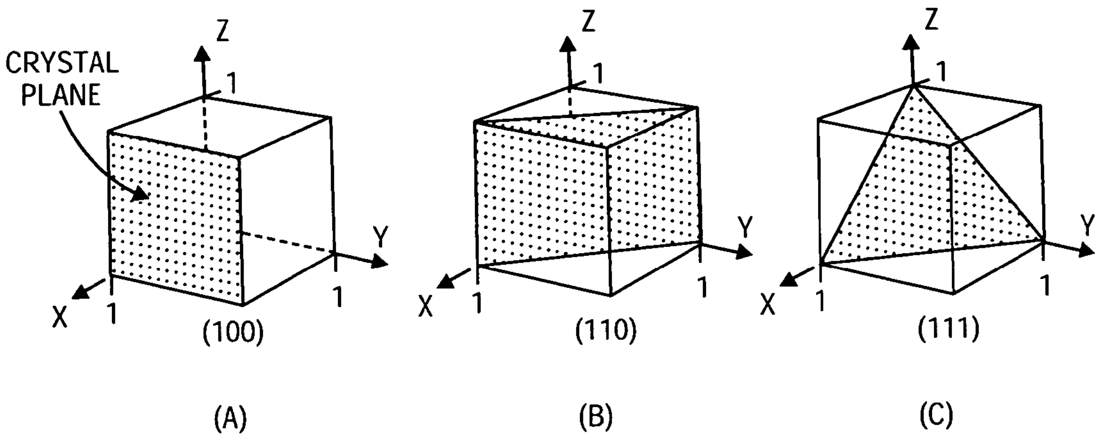
FIG. 1 is a schematic diagram showing the three types of crystalline orientation for silicon.

These planes describe the orientation of the plane of silicon atoms relative to the principle crystalline axes. The numbers {xyz} are referred to as Miller indices and are determined from the reciprocals of the points at which the crystal plane of silicon intersects the principle crystalline axes. Thus, FIG. 1 shows three orientations of the crystal plane of silicon. In FIG. 1(A), the crystal plane of silicon intersects the x-axis at 1 and never intersects the y or z-axis. Therefore, the orientation of this type of crystalline silicon is {100}. Similarly, FIG. 1(B) shows {110} crystalline silicon and FIG. 1(C) shows {111} silicon. The {111} and {100} orientations are the two primary wafer orientations in commercial use.

Note that for any given plane in a cubic crystal there are five other equivalent planes. Thus, the six sides of the cube comprising the basic unit cell of the crystal are all considered {100} planes. The notation {xyz} refers to all six of the equivalent planes.

Reference will also be made herein to the crystal directions, especially the <100>, <110> and <111> directions. These are defined as the normal direction to the respective plane. Thus, the <100> direction is the direction normal to the {100} plane. The notation <xyz> refers to all six equivalent directions.

Figure 2:
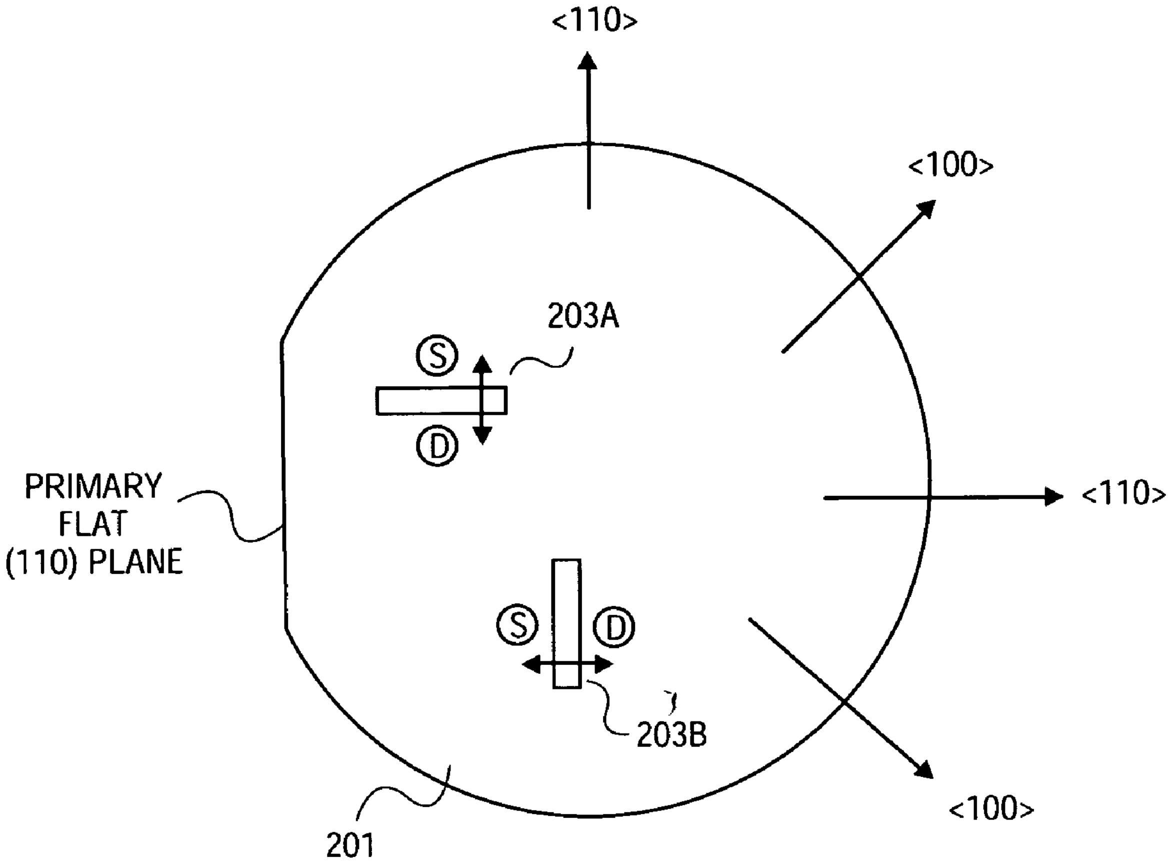
FIG. 2 is a schematic diagram showing a prior art orientation of CMOS devices on a semiconductor wafer.

As noted above, in the prior art, most MOS transistors are fabricated on {100} silicon with the gates oriented such that current flows parallel to the <110> directions. This is shown in FIG. 2.

Figure 3:
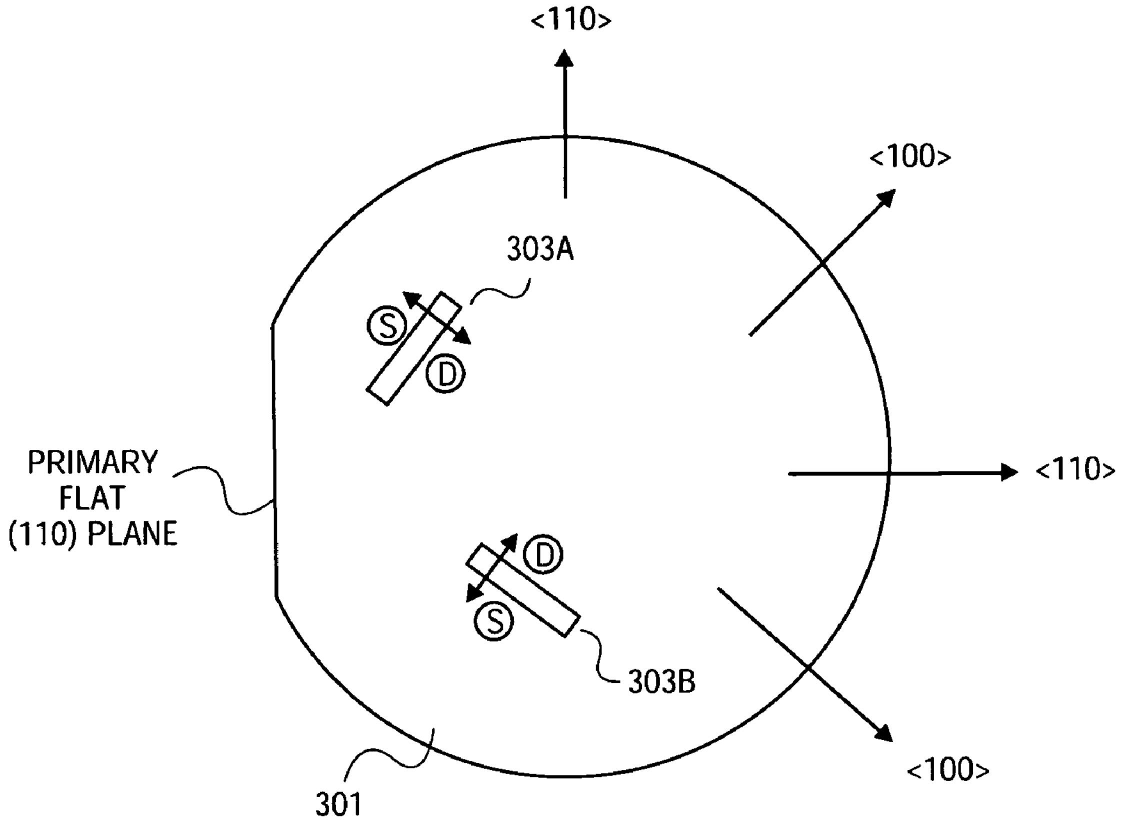
FIG. 3 is a schematic diagram showing an orientation of CMOS devices on a semiconductor wafer in accordance with the present invention.

In accordance with the present invention, the MOS transistors are oriented so that current flow is substantially along the <100> direction as shown in FIG. 3. FIG. 3 shows a top view of a semiconductor wafer 301 formed from {100} silicon. Transistor devices, formed on the semiconductor wafer 301, are represented by transistors 303*a* and 303*b*. The orientation of the transistors 303*a* and 303*b* are such that current that flows between the source and drain of the transistors is substantially along the <100> direction of the semiconductor wafer 301. Clearly, the transistors 303*a* and 303*b* are not drawn to scale and are meant to be exemplary.

Thus, in accordance with one embodiment of the present invention, devices formed on the silicon wafer have a specific device orientation and a fabrication process is used that induces longitudinal tensile stress in the channel region of the devices. The longitudinal tensile stress on the channel will increase the mobility of electrons without degrading the mobility of holes.

In the prior art, devices were oriented such that the current flows substantially along the <110> directions on {100} silicon. In this orientation, the mobilities of electrons and holes change in opposite directions in reaction to longitudinal tensile stress. Thus, the overall CMOS circuit performance is not enhanced. For this reason, selective stressing is employed to increase the carrying mobility of one type of device without degrading the other. This requires costly processing steps.

By orienting the devices to have their current flow in the <100> direction, this reduces or reverses the relative degradation of one carrier mobility commensurate with a given amount of increase in the mobility of the other type of carrier due to stress. This eliminates the need for selective stressing to realize an acceptable overall performance gain. The orientation of the present invention enables stress to be used as a tool to increase CMOS circuit performance.

Figure 4A:
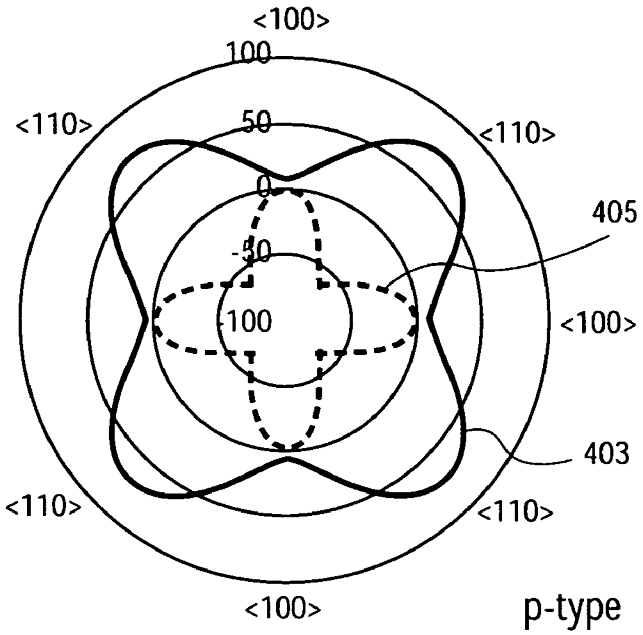
FIG. 4A is a chart showing the piezoresistive coefficients for a P-type {100} silicon substrate as a function of current flow direction.
Figure 4B:
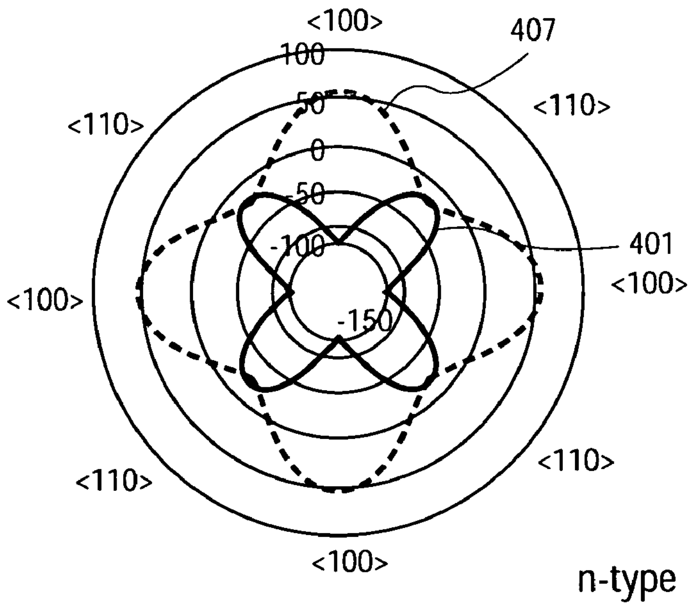
FIG. 4B is a chart showing the piezoresistive coefficients for an N-type {100} silicon substrate as a function of current flow direction.

The piezoresistive coefficients for silicon are anisotropic relative to the direction of current flow. FIG. 4*a* shows the piezoresistive coefficient for a p-type region of a semiconductor substrate and FIG. 4*b* shows the piezoresistive coefficient for an n-type region of a semiconductor substrate as a function of direction of current flow on the {100} surfaces. NMOS transistors are known to behave similarly to n-type regions and have similar piezoresistive coefficients, as do PMOS transistors and p-type regions. Thus, FIGS. 4*a* and 4*b* are applicable to NMOS and PMOS transistors.

The piezoresistive coefficients relate the change in resistance along various directions when stress is applied. Positive values indicate an increase in resistance for tensile stress. The change in resistance is inversely proportional to the change in mobility, which is directly proportional to the speed of the transistor. Thus, a higher resistance results in a slower transistor.

Figure 5:
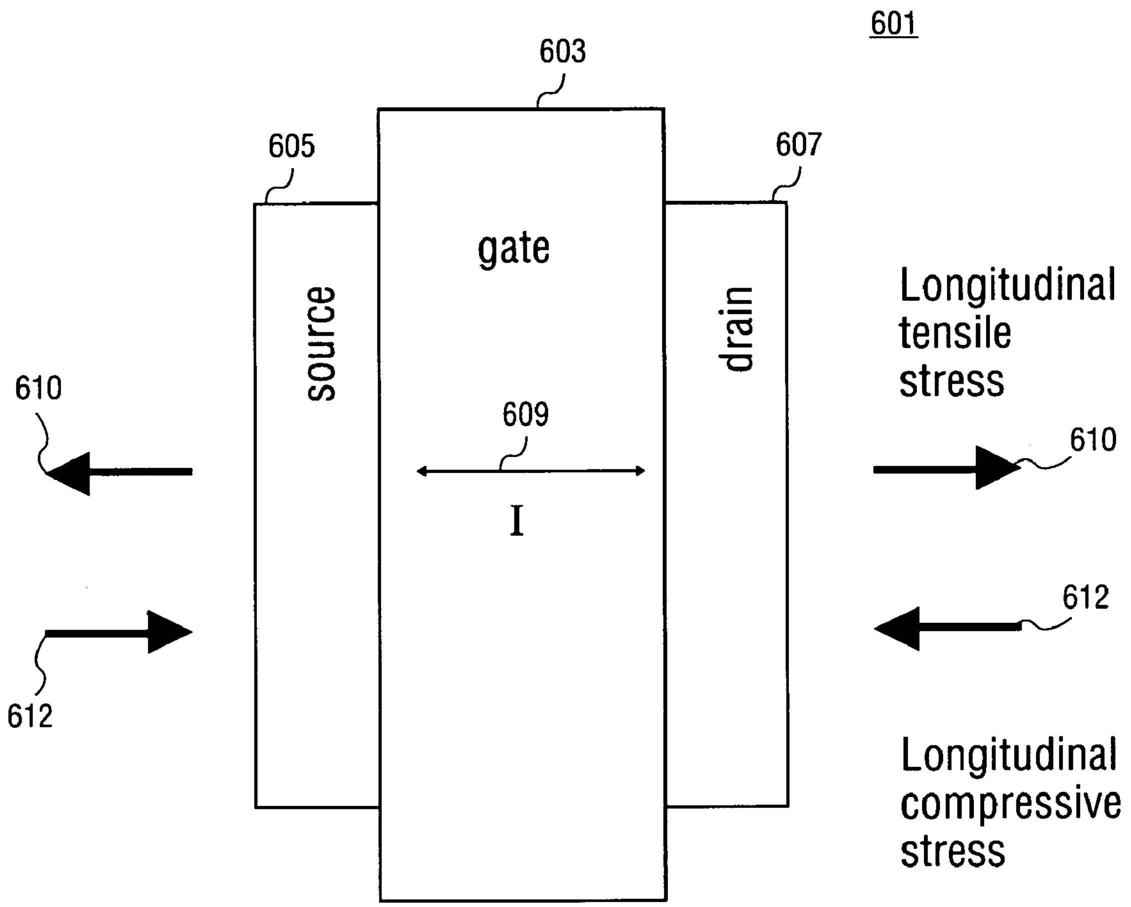
FIG. 5 shows a transistor that is undergoing longitudinal tensile stress.

A longitudinal tensile stress is defined as a "stretching" of the channel in the same direction in which current flows. For example, as seen in FIG. 5, a transistor 601 is seen that has a gate 603, a source 605, and a drain 607. When an appropriate voltage is applied to the gate 603, current flows between the source 605 and the drain 607 along the direction arrow 609. A longitudinal tensile stress would be stress that tends to move the source 605 and drain 607 apart along direction 610. Additionally, a longitudinal compressive stress would be stress that tends to move the source 605 and drain 607 closer together along direction 612.

Figure 6:
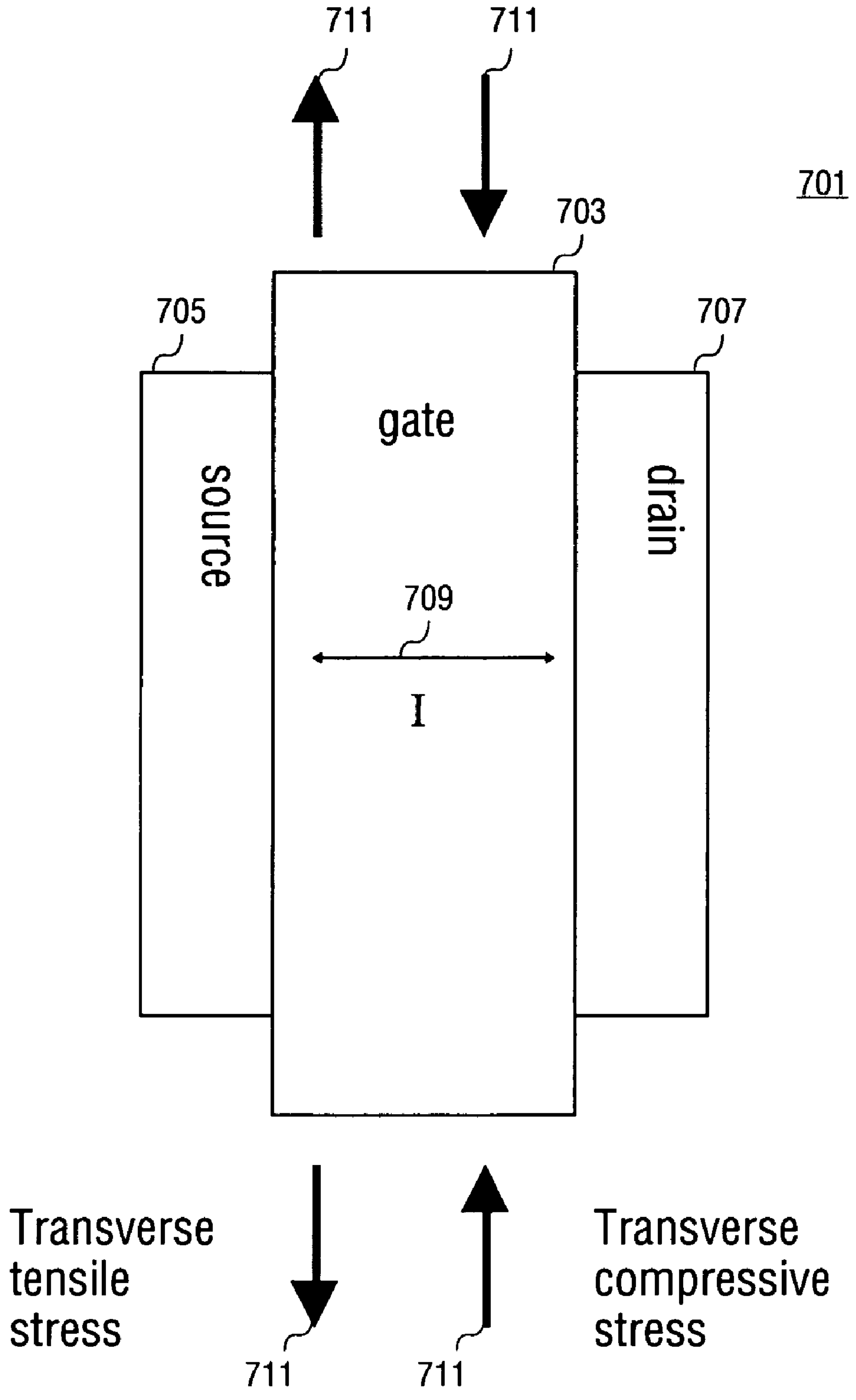
FIG. 6 shows a transistor that is undergoing transverse tensile stress.

A transverse tensile stress is defined as a "stretching" of the channel in a direction orthogonal to which the current flows. For example, as seen in FIG. 6, a transistor 701 is seen that has a gate 703, a source 705, and a drain 707. When an appropriate voltage is applied to the gate 703, current flows between the source 705 and the drain 707 along the direction arrow 709. A transverse tensile stress would be stress that is in a direction 711 that is orthogonal to the direction of current flow 709.

As seen in FIG. 4*b*, when a longitudinal tensile stress (as indicated by solid line 401) is applied to an n-type region of a semiconductor wafer, the piezoresistive coefficient is at a minimum (approx −100 units) in the <100> direction. As seen in FIG. 4*a*, when the same longitudinal tensile stress (as indicated by solid line 403) is applied to a p-type region of the semiconductor wafer, the piezoresistive coefficient is only slightly above the neutral condition (0 units).

Thus, in accordance with one embodiment of the present invention, transistors should be oriented to have current flowing in the <100> direction and applying longitudinal tensile stress in the <100> direction. This will result in an increase in the speed of NMOS transistors without affecting the PMOS transistors. This is preferable to the <110> orientation of the prior art, where the PMOS transistor is degraded with the addition of such stress, necessitating a cumbersome selective stress processing to enable an overall gain.

In accordance with an alternative embodiment, it is possible to orient the transistor devices to have current flow in the <110> direction while applying a transverse stress (as indicated by the dashed lines 405 and 407). For PMOS transistors, this gives about a −70 value and for NMOS transistors, this gives about a −25 value. However, in practice, this is difficult to accomplish because transistors are typically many times wider than they are long. Thus, a force applied on the side of the channel, which would cause transverse stress, is greatly diminished in the middle of the channel.

The particular details of introducing a longitudinal tensile stress on a substrate are well known in the art and will not be discussed in detail herein. For example, in one embodiment, application of high-tensile nitride dielectric is used. The high-tensile nitride dielectric is also referred to herein as a "stressor" structure that will implement the tensile stress. Alternatively, in another embodiment, the stressor structure may be a tensile shallow trench isolation (STI) fill. Although two examples of stressors are given as an example, the term "stressor" as used herein shall mean any structure that causes tensile stress. Additionally, the formation of transistors oriented to have their current flow in the <100> direction is relatively straightforward. This can be done, for example, by rotating either the underlying semiconductor wafer or the production masks 45 degrees relative to the prior art orientation (for a {100} silicon wafer).

While specific embodiments and applications of the present invention have been illustrated and described, it is to be understood that the invention is not limited to the precise configuration and components disclosed herein. Various modifications, changes, and variations, which will be apparent to those skilled in the art, may be made in the arrangement, operation, and details of the methods and systems of the present invention disclosed herein without departing from the spirit and scope of the invention.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:

a semiconductor substrate formed from {100} silicon;

a PMOS transistor formed on said semiconductor substrate, the PMOS transistor having a PMOS channel for carrying current and oriented so that current flows in a <100> direction;

an NMOS formed on the semiconductor substrate, said NMOS transistor having an NMOS channel for carrying current and oriented so that current flows in a <100> direction; and a stressor that causes a longitudinal tensile stress on said NMOS channel and/or said PMOS channel, wherein said stressor is to increase a mobility of holes in the semiconductor wafer, but not degrade a mobility of electrons in the semiconductor wafer.

2. The integrated circuit of claim 1 wherein the stressor is a high-tensile nitride dielectric or a tensile shallow trench isolation fill.

3. A method, comprising:

forming an NMOS device and a PMOS device on a semiconductor wafer, the NMOS device and the PMOS device having an orientation such that current is to flow substantially along a <100> direction of the semiconductor wafer; and introducing a longitudinal tensile stress in at least a portion of the semiconductor wafer; and increasing a mobility of electrons in the semiconductor wafer, but not degrading a mobility of holes in the semiconductor wafer.

4. The method of claim 3, wherein forming the NMOS device and the PMOS device on the semiconductor wafer includes rotating the semiconductor wafer forty-five degrees from a <110> direction of the semiconductor wafer.

5. The method of claim 3, wherein introducing the longitudinal tensile stress in the semiconductor wafer includes applying a tensile shallow trench isolation (STI) fill along the <100> direction of the semiconductor wafer.

6. The method of claim 3, wherein forming the NMOS device and the PMOS device on the semiconductor wafer includes rotating a production mask forty-five degrees from a <110> direction of the semiconductor wafer.

7. The method of claim 3, wherein introducing the longitudinal tensile stress in the semiconductor wafer includes applying a high-tensile nitride dielectric along the <100> direction of the semiconductor wafer.

8. An apparatus, comprising:

an NMOS device and a PMOS device formed on a semiconductor wafer, the NMOS device and the PMOS device having an orientation such that current is to flow substantially along a <100> direction of the semiconductor wafer; and a stressor applied to at least a portion of the semiconductor wafer to introduce a longitudinal tensile stress in the semiconductor wafer, wherein said stressor is to increase a mobility of first charge carriers in the semiconductor wafer, but not degrade a mobility of second charge carriers in the semiconductor wafer.

9. The apparatus of claim 8, wherein the stressor includes a high-tensile nitride dielectric.

10. The apparatus of claim 8, wherein the stressor includes a tensile shallow trench isolation (STI) fill.

11. The apparatus of claim 8, wherein at least one of the NMOS device or the PMOS device includes a channel region, and wherein the stressor is applied in the channel region.

* * * * *